United States Patent
Kido

(10) Patent No.: US 10,027,911 B2
(45) Date of Patent: Jul. 17, 2018

(54) SOLID-STATE IMAGING DEVICE AND ELECTRONIC DEVICE

(71) Applicant: Sony Corporation, Tokyo (JP)

(72) Inventor: Hideo Kido, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 125 days.

(21) Appl. No.: 13/919,450

(22) Filed: Jun. 17, 2013

(65) Prior Publication Data

US 2014/0002704 A1     Jan. 2, 2014

(30) Foreign Application Priority Data

Jun. 28, 2012   (JP) ................................. 2012-145615

(51) Int. Cl.
   *H04N 5/363*    (2011.01)
   *H01L 27/146*   (2006.01)

(52) U.S. Cl.
   CPC ....... *H04N 5/363* (2013.01); *H01L 27/14616* (2013.01); *H01L 27/14641* (2013.01)

(58) Field of Classification Search
   CPC ................................................ H01L 27/14609
   USPC .................................................. 257/292, 291
   See application file for complete search history.

(56) References Cited

U.S. PATENT DOCUMENTS

| 7,242,043 B2* | 7/2007 | Ohkawa ........................ 257/292 |
| 2006/0076587 A1* | 4/2006 | Hirai .................. H01L 27/14806 257/291 |
| 2006/0208291 A1* | 9/2006 | Koizumi et al. .............. 257/292 |
| 2007/0034965 A1* | 2/2007 | Jung .................. H01L 27/14603 257/369 |
| 2009/0200627 A1* | 8/2009 | Moon .................. G11B 17/228 257/432 |
| 2011/0227091 A1* | 9/2011 | Toda .................. H01L 27/1463 257/76 |
| 2011/0241079 A1* | 10/2011 | Oike ................. H01L 27/14616 257/225 |
| 2011/0241089 A1* | 10/2011 | Ohri .................. H01L 27/14607 257/291 |
| 2011/0242386 A1* | 10/2011 | Machida ........... H01L 27/14603 348/308 |
| 2014/0167124 A1* | 6/2014 | Kobayashi .......... H01L 27/1461 257/291 |

FOREIGN PATENT DOCUMENTS

JP       2009-212248       9/2009

* cited by examiner

*Primary Examiner* — Bo Fan
(74) *Attorney, Agent, or Firm* — Chip Law Group

(57) ABSTRACT

There is provided a solid-state imaging device including a plurality of photoelectric conversion units, a signal line that is wired along the plurality of photoelectric conversion units, and an output transistor that is electrically connected to each of the photoelectric conversion units and includes a gate electrode and two impurity regions, the two impurity regions being disposed on both sides of the gate electrode and being different in sizes in terms of at least one of a dimension in a channel width direction and a depth, the signal line being connected to one of the two impurity regions that has a smaller size.

13 Claims, 11 Drawing Sheets

SOLID-STATE IMAGING DEVICE AND ELECTRONIC DEVICE

BACKGROUND

The present technology relates to a solid-state imaging device and an electronic device, and more particularly, to a solid-state imaging device with a CMOS configuration and an electronic device using the solid-state imaging device.

Of solid-state imaging devices, a so-called CMOS type solid-state imaging device in which a pixel driving circuit is installed in each pixel has a configuration in which a charge converted in a photoelectric conversion unit of each pixel is amplified by an amplification transistor installed in the pixel driving circuit and the amplified charge is output to a signal line.

In such a CMOS type solid-state imaging device, random noise (Random Telegraph Signal Noise) occurs due to miniaturization of the amplification transistor, and thus a problem that the noise may cause a blinking point and display characteristics may thus deteriorate occurs. As a configuration for preventing the noise, for example, a configuration in which a gate area of the amplification transistor is designed to be greater than a gate area of another transistor forming the pixel driving circuit has been suggested (see Japanese Unexamined Patent Application Publication No. 2009-212248).

SUMMARY

In the above-described CMOS type solid-state imaging device, however, a plurality of pixel driving circuits are connected to one signal line. Here, a connection portion of a pixel circuit to each signal line is a source/drain of a transistor and is an impurity region that becomes a capacitance component in which an operation speed of a signal line is delayed. Therefore, an increase in the number of pixels causes an increase in the capacitance component connected to the signal line, and consequently causes a problem that a reading operation speed of an image signal may be lowered.

It is desirable to provide a solid-state imaging device capable of reading an image signal at a high speed even when the solid-state imaging device has a configuration in which the number of pixels increases and an electronic device using the solid-state imaging device to improve performance.

According to an embodiment of the present technology, there is provided a solid-state imaging device including a plurality of photoelectric conversion units; a signal line that is wired along the plurality of photoelectric conversion units; and an output transistor electrically connected to each photoelectric conversion unit. In particular, the output transistor has a configuration in which two impurity regions different in at least one size of a dimension in a channel width direction and a depth are disposed on both sides of a gate electrode. The signal line is connected to the impurity region with the smaller size between the two impurity regions.

According to another embodiment of the present technology, there is provided an electric device including the solid-state imaging device having this configuration.

In the solid-state imaging device with this configuration, the sizes of the two impurity regions forming the output transistor are configured to be different and the impurity region with the smaller size is connected to the signal line. Accordingly, since a capacity element is reduced in each impurity region connected to the signal line, an operation speed of the signal line is designed to be improved.

According to the embodiments of the present disclosure described above, an operation speed of the signal line is improved by reducing the capacitance component by each impurity region connected to the signal line. Even when the number of pixels increases, it is possible to read an imaging signal at a high speed via the signal line.

DETAILED DESCRIPTION OF THE EMBODIMENTS

Figure 1:
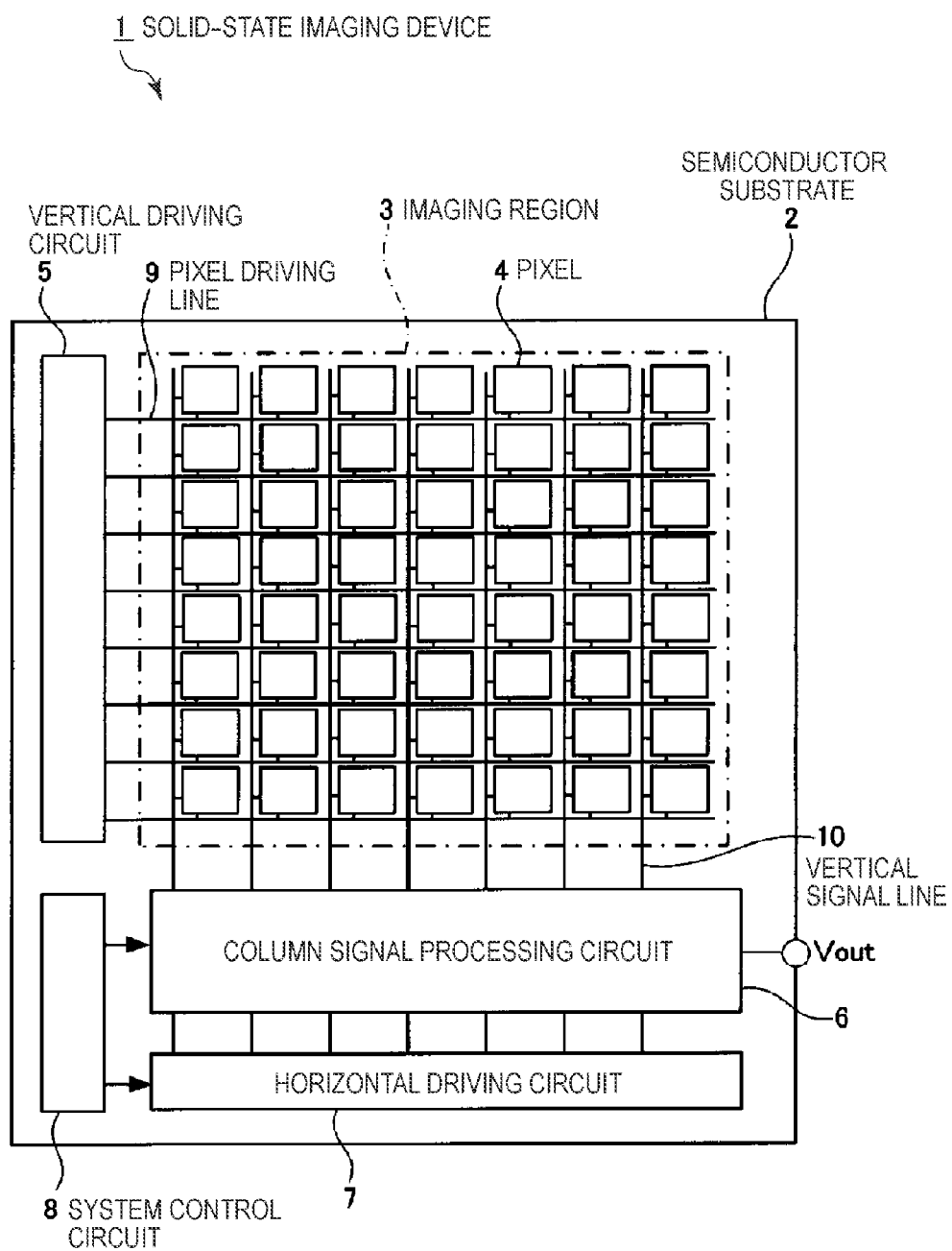
FIG. 1 is a schematic diagram illustrating an example of the configuration of a solid-state imaging device according to an embodiment of the present technology.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, embodiments of the present technology will be described with reference to the drawings in the following order.

1. Example of overall configuration of solid-state imaging device according to embodiment
2. First embodiment (example of solid-state imaging device in which selection transistor serves as output transistor)
3. First modification example (example in which position of gate electrode of output transistor is changed)
4. Second modification example (example of adjustment by depth of impurity region of output transistor)
5. Third modification example (example in which photoelectric conversion unit is expanded)
6. Second embodiment (first example of solid-state imaging device in which amplification transistor serves as output transistor)

7. Third embodiment (second example of solid-state imaging device in which amplification transistor serves as output transistor)

8. Fourth embodiment (electronic device using solid-state imaging device)

1. Example of Overall Configuration of Solid-State Imaging Device According to Embodiment FIG. 1 is a schematic diagram illustrating the configuration of a MOS type solid-state imaging device as an example of a solid-state imaging device according to an embodiment of the present technology.

A solid-state imaging device 1 illustrated in the drawing includes an imaging region 3 on one main surface of a semiconductor substrate 2 formed of, for example, single crystalline silicon. In the imaging region 3, a plurality of pixels 4 are regularly arrayed two-dimensionally. Each pixel 4 includes a photoelectric conversion unit that includes an impurity region and a pixel driving circuit that includes a floating diffusion, a read gate, and a plurality of other transistors (so-called MOS transistors). A part of the pixel driving circuit is shared by the plurality of pixels 4 in some cases.

Peripheral circuits such as a vertical driving circuit 5, column signal processing circuits 6, a horizontal driving circuit 7, and a system control circuit 8 are formed in the periphery of the above-described imaging region 3.

The vertical driving circuit 5 includes, for example, a shift register. The vertical driving circuit 5 selects a pixel driving line 9, supplies a pulse used to drive the pixels 4 to the selected pixel driving line 9, and drives the pixels 4 arrayed in the imaging region 3 in units of rows. That is, the vertical driving circuit 5 sequentially selects and scans the pixels arrayed in the imaging unit 3 in the vertical direction in the units of rows. A pixel signal based on a signal charge generated according to an amount of received light in each pixel 4 is supplied to the column signal processing circuit 6 via a signal line 10 wired perpendicularly to the pixel driving line 9.

For example, the column signal processing circuit 6 is arrayed for each row and performs signal processing such as noise removal on signals output from the pixel 4 of one line for each pixel row. That is, the column signal processing circuit 6 performs signal processing such as correlated double sampling (CDS) performed to remove fixed pattern noise unique to the pixels, signal amplification, or analog/digital conversion (AD conversion).

The horizontal driving circuit 7 includes, for example, a shift register. The horizontal driving circuit 7 sequentially outputs a horizontal scanning pulse to sequentially select the column signal processing circuits 6 and outputs a pixel signal from each column signal processing circuit 6.

The system control circuit 8 receives an input clock and data used to give an instruction of an operation mode or the like and outputs data such as internal information of the solid-state imaging device 1. That is, the system control circuit 8 generates a clock signal or a control signal serving as a reference of operations of the vertical driving circuit 5, the column signal processing circuits 6, the horizontal driving circuit 7, and the like based on a vertical synchronization signal, a horizontal synchronization signal, and a master clock. These signals are input to the vertical driving circuit 5, the column signal processing circuit 6, the horizontal driving circuit 7, and the like.

The above-described peripheral circuits 5 to 8 and the above-described pixel driving circuits installed in the imaging region 3 are configured as the driving circuits driving the respective pixels 4. The peripheral circuits 5 to 8 may be disposed at positions at which the peripheral circuits 5 to 8 are stacked on the imaging region 3.

2. First Embodiment (Example of Solid-State Imaging Device in which Selection Transistor Serves as Output Transistor)

Figure 2:
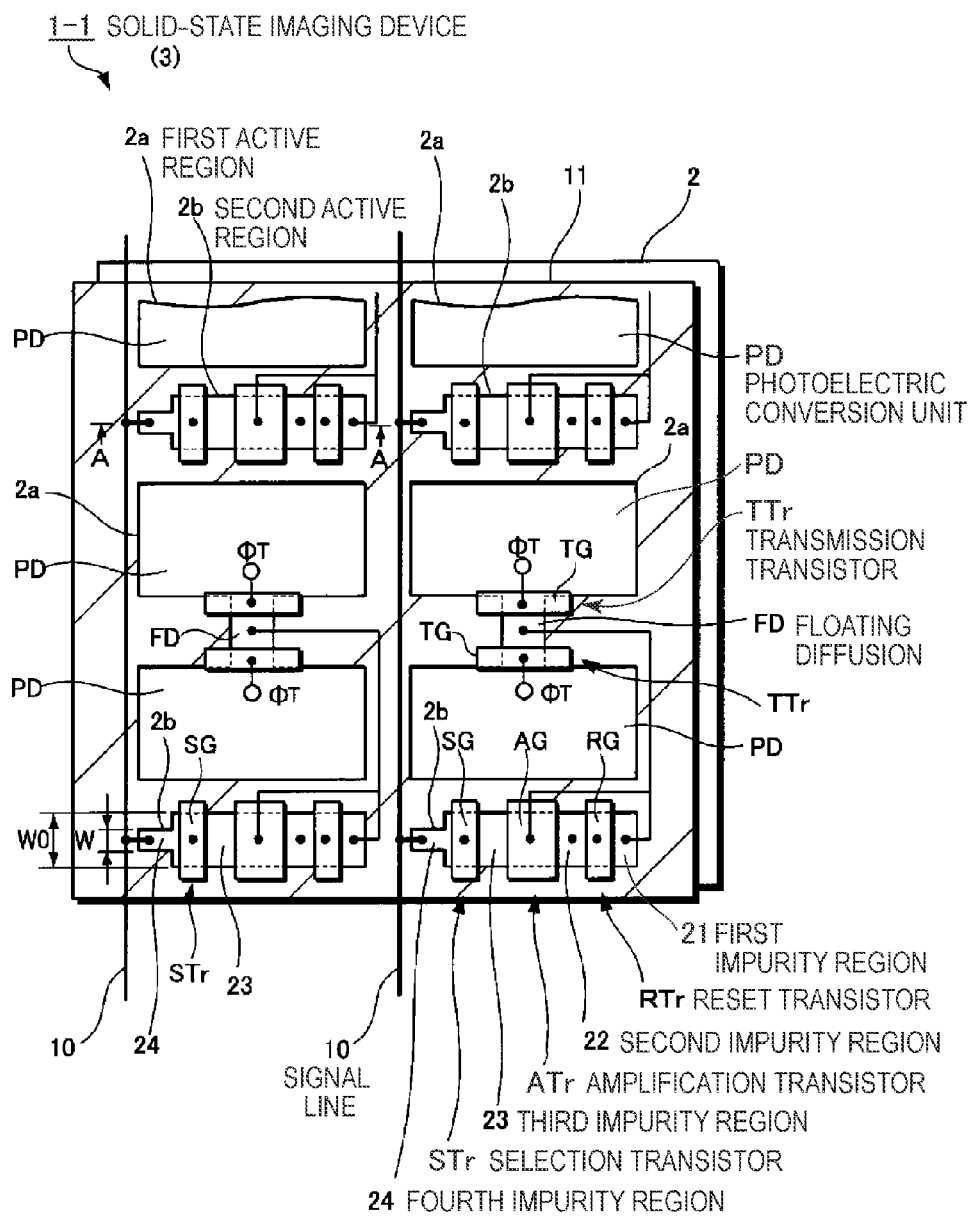
FIG. 2 is a plan view illustrating the configuration of main units of a solid-state imaging device according to a first embodiment.
Figure 3:
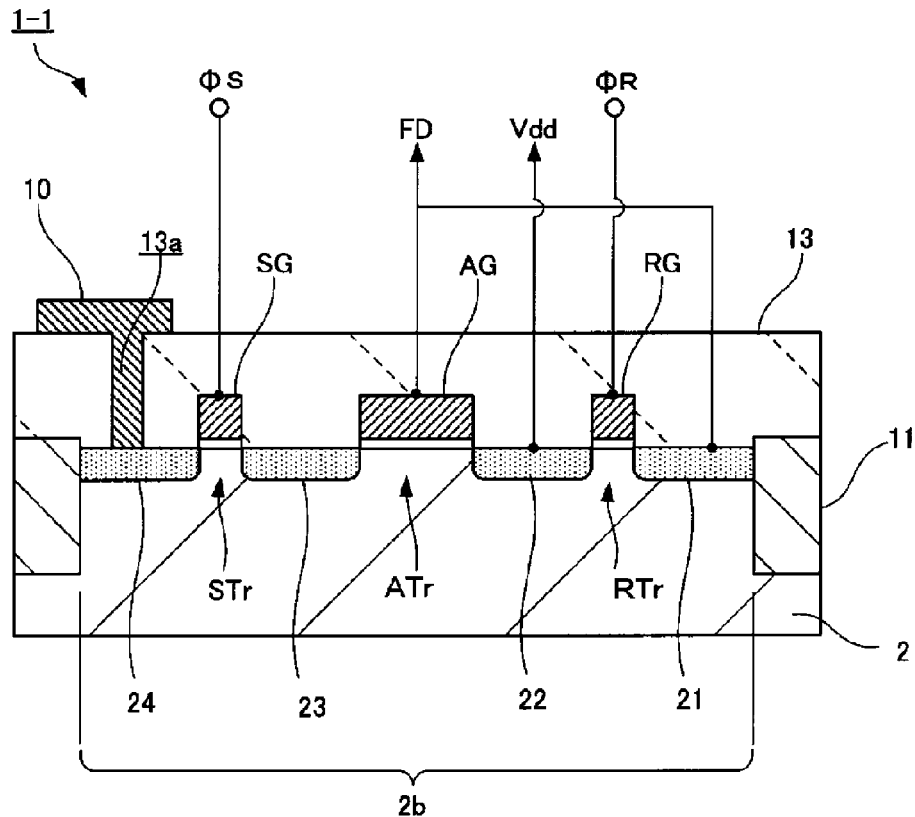
FIG. 3 is a sectional view taken along line A-A of FIG. 2.

FIG. 2 is a schematic plan view illustrating the configuration of the main units of a solid-state imaging device 1-1 according to the first embodiment and corresponds to a partially expanded plan view of the imaging region 3 in FIG. 1. FIG. 3 is a sectional view taken along line A-A of FIG. 2.

As illustrated in the drawings, a plurality of first active regions 2a and a plurality of second active regions 2b into which one main surface of a semiconductor substrate 2 is divided by element separations 11 are formed in the imaging region 3 of the solid-state imaging device 1-1 according to the first embodiment. A photoelectric conversion unit PD and four transistors TTr, RTr, ATr, and STr are disposed in correspondence with the first active region 2a and the second active region 2b.

The four transistors form a pixel driving circuit and include a transmission transistor TTr, a reset transistor RTr, an amplification transistor ATr, and a selection transistor STr. Of the four transistors, the transmission transistor TTr is installed in the first active region 2a together with the photoelectric conversion unit PD. On the other hand, the three transistors—the reset transistor RTr, the amplification ATr, and the selection transistor STr—are installed in the second active region 2b. The three transistors RTr, ATr, and STr are commonly installed for two photoelectric conversion units PD and two pixels are configured to share a part of the pixel driving circuit.

In the above-described configuration according to the first embodiment, the selection transistor STr installed in the second active region 2b is connected as an output transistor to a signal line 10. As characteristics, the selection transistor STr configured as the output transistor is characterized in that the selection transistor STr has two impurity regions with different sizes. Accordingly, an opening shape of the second active region 2b in which the selection transistor STr is installed is characterized in that a part of an opening width has a narrow shape.

Hereinafter, the detailed configuration of each constituent element described above will be described in the order of the first active region 2a and the second active region 2b, the photoelectric conversion unit PD, the transmission transistor TTr, the reset transistor RTr, the amplification transistor ATr, the selection transistor STr, and the signal line 10. Subsequently, driving of the solid-state imaging device 1-1 will be described.

<First Active Region 2a and Second Active Region 2b>

The first active region 2a and the second active region 2b are regions separated by the element separation 11 installed in the semiconductor substrate 2 and are semiconductor regions in which elements are formed. For example, the element separation 11 is formed as an insulation region such as a groove type element separation. Here, the element separation 11 separates the first active region 2a and the second active region 2b as mutually independent semiconductor regions.

Of the first active region 2a and the second active region 2b, the first active region 2a is formed to have a planar shape continuously opening portions in which two photoelectric conversion units PD and the floating diffusion FD installed between the two photoelectric conversion units PD are formed.

On the other hand, the second active region 2b is formed along the first active region 2a so as to have a predetermined opening width W0. One end in the length direction of the second active region 2b is formed so as to have an opening width W (<W0) with a size smaller than that of the opening width W0. A part of the opening width W with the smaller size is formed, for example, in the middle of the predetermined opening width W0. The opening width W may be regular, or may not be regular, or may be tapered toward the end edge of the second active region 2b. For example, the opening width W with the smaller size satisfies a relation of about [W]<[(2/3)×W0] with respect to the predetermined opening width W0.

The opening shape of the second active region 2b is not limited to the illustrated shape, as long as a portion with the opening width W of the smaller size extends to one end in the length direction of a portion configured to have the opening width W0. For example, the portion of the opening width W with the smaller size may be formed to be biased toward one side in the width direction of the portion configured to have the predetermined opening width W0.

In this embodiment, the case in which the first active region 2a and the second active region 2b are installed to be independent from each other has been exemplified. However, the first active region 2a and the second active region 2b may be formed as continuous regions.

<Photoelectric Conversion Unit PD>

The photoelectric conversion units PD illustrated only in the plan view of FIG. 2 are installed in the first active region 2a of the semiconductor substrate 2. Each photoelectric conversion unit PD is a photodiode that includes a p-type impurity region and an n-type impurity region formed in the first active region 2a and is installed to occupy a large region of each pixel. The photoelectric conversion units PD are formed at a depth at which at least the element separation 11 is formed using the element separation 11 as a mask and have a planar shape substantially identical with the opening shape of the first active region 2a. Here, for example, the photoelectric conversion unit PD is configured by a pn junction between an n-type impurity region that serves as an accumulation region installed inside the p-type semiconductor substrate 2 and a p-type impurity region that comes into contact with the n-type impurity region and is installed in a surface layer or in an internal portion of the semiconductor substrate 2.

<Transmission Transistor TTr>

The transmission transistor TTr illustrated only in the plan view of FIG. 2 is installed in the first active region 2a using the photoelectric conversion unit PD as a part of the constituent element. The transmission transistor TTr is adjacent to the photoelectric conversion unit PD and includes a transmission gate TG that is installed on the first active region 2a and the floating diffusion FD that is installed to be adjacent to the transmission gate TG. The floating diffusion FD is an impurity region formed in a surface layer of the first active region 2a of the semiconductor substrate 2 and is an impurity region of the same conductive type (here, the n type) as the accumulation region forming the photoelectric conversion unit PD.

Thus, the transmission transistor TTr operates as an n-channel MOS transistor in which the n-type impurity region forming the accumulation region of the photoelectric conversion unit PD and the floating diffusion FD formed as the n-type impurity region are set as a source/drain.

Each transmission transistor TTr is configured such that one floating diffusion FD is shared by two photoelectric conversion units PD and the transmission gates TG. Therefore, the two photoelectric conversion units PD sharing the floating diffusion FD are installed in the continuously opened first active region 2a.

In the above-described configuration, the floating diffusion FD is connected to the reset transistor RTr and the amplification transistor ATr to be described below. The transmission gate TG is connected to a pixel driving line (not illustrated here) and is supplied with a transmission signal ϕT.

The configuration of the transmission transistor TTr is not limited to the above-described configuration. For example, a floating diffusion FD may be installed in each of the photoelectric conversion unit PD and the transmission gate TG. Further, one floating diffusion FD may be configured to be shared by three or more photoelectric conversion units PD and the transmission gates TG.

<Reset Transistor RTr>

The reset transistor RTr is installed in a portion with the predetermined opening width W0 in the second active region 2b. The reset transistor RTr includes a reset gate RG that is installed to intersect the second active region 2b in the direction of the opening width W0, and a first impurity region 21 and a second impurity region 22 that are formed on both sides of the reset gate RG in the second active region 2b. The first impurity region 21 and the second impurity region 22 have a planar shape in which the element separation 11 and the reset gate RG are used as masks. Accordingly, the first impurity region 21 and the second impurity region 22 have the same dimension in a channel width direction. Here, the channel width direction refers to a direction in which the gate intersects the active region. The first impurity region 21 and the second impurity region 22 are formed at the same depth in the surface layer of the semiconductor substrate 2.

In the above-described configuration, a pixel driving line (not illustrated here) is connected to the reset gate RG and a reset signal ϕR is input. The first impurity region 21 and the second impurity region 22 are a so-called source/drain. The first impurity region 21 is connected to the floating diffusion FD and the second impurity region 22 is supplied with a power voltage Vdd.

<Amplification Transistor ATr>

The amplification transistor ATr is installed in a portion with the predetermined opening width W0 in the second active region 2b so as to share the second impurity region 22 of the reset transistor RTr. The amplification transistor ATr includes an amplification gate AG that is installed to intersect the second active region 2b in the direction of the opening width W0, and the second impurity region 22 and a third impurity region 23 that are installed on both sides of the amplification gate AG in the second active region 2b. The second impurity region 22 and the third impurity region 23 have a planar shape in which the element separation 11 and the amplification gate AG are used as masks. Accordingly, the second impurity region 22 and the third impurity region 23 have the same dimension in a channel width direction. The second impurity region 22 and the third impurity region 23 are formed at the same depth in the surface layer of the semiconductor substrate 2.

In the above-described configuration, the amplification gate AG is connected to the floating diffusion FD. The second impurity region 22 and the third impurity region 23 are a so-called source/drain. As described above, the second impurity region 22 is supplied with the power voltage Vdd.

<Selection Transistor STr>

The selection transistor STr is used as an output transistor and is disposed from the portion with the predetermined opening width W0 in the second active region 2b to a portion with the opening width W of the smaller size. The selection transistor STr is installed to share the third impurity region 23 of the amplification transistor ATr. Thus, the selection transistor STr is electrically connected to the photoelectric conversion unit PD via the floating diffusion FD of the amplification transistor ATr and the transmission transistor TTr.

The selection transistor STr includes a selection gate SG that is installed to intersect the second active region 2b in the direction of the opening width W0, and the third impurity region 23 and a fourth impurity region 24 that are installed on both sides of the selection gate SG in the second active region 2b.

Of the selection gate SG, the third impurity region 23, and the fourth impurity region 24, the selection gate SG is disposed on the portion with the predetermined opening width W0 in the second active region 2b. Therefore, of the third impurity region 23 and the fourth impurity region 24, the entire third impurity region 23 shared with the amplification transistor ATr is installed in the portion with the predetermined opening width W0 in the second active region 2b. On the other hand, the other fourth impurity region 24 is installed across the portion with the predetermined opening width W0 and the portion with the opening width W of the smaller size in the second active region 2b. The third impurity region 23 and the fourth impurity region 24 have a planar shape in which the element separation 11 and the selection gate SG are used as masks. Accordingly, the third impurity region 23 and the fourth impurity region 24 can be said to have different dimensions in the channel width direction of the selection transistor STr including the third impurity region 23 and the fourth impurity region 24.

In the above-described configuration, the pixel driving line (not illustrated here) is connected to the selection gate SG and a selection signal φS is input. The third impurity region 23 and the fourth impurity region 24 are a so-called source/drain and the fourth impurity region 24 with the smaller size in the above-described channel width direction is connected to the signal line 10.

<Signal Line 10>

The signal lines 10 are wired in the vertical direction along the array of the photoelectric conversion units PD. As illustrated in FIG. 3, each signal line 10 is formed in an upper portion of an inter-layer insulation film 13 formed to cover the semiconductor substrate 2 in which the element separation 11 is formed. Each signal line 10 is connected to the fourth impurity region 24 forming each selection transistor STr disposed between the photoelectric conversion units PD via a connection hole 13a formed in the inter-layer insulation film 13.

The fourth impurity regions 24 of the plurality of selection transistors STr disposed along the signal line 10 are connected to one signal line 10. For example, when the pixels of the number of 4000 horizontal pixels×the number of 2000 vertical pixels are arrayed within the imaging region 3 and two photoelectric conversion units arrayed in the vertical direction share one pixel driving circuit, 1000 fourth impurity regions 24 are connected to one signal line 10.

<Driving of Solid-State Imaging Device 1-1>

The pixel driving circuits of the solid-state imaging device 1-1 including the above-described constituent elements is driven as follows, as in a general pixel driving circuit configured to include 4 transistors. That is, first, a signal charge (here, electrons) photoelectrically converted and accumulated in the photoelectric conversion unit PD is transmitted to the floating diffusion FD when the transmission signal φT is given to the transmission gate TG.

Before the signal charge is transmitted from the photoelectric conversion unit PD to the floating diffusion FD, the reset signal φR is given to the reset gate RG. Thus, the potential of the floating diffusion FD is reset.

After the potential of the floating diffusion FD is reset, the selection signal φS is given to the selection gate SG. Thus, the potential of the floating diffusion FD is output as a reset potential from the amplification transistor ATr to the signal line 10 via the selection transistor STr. Even after the signal charge is transmitted from the photoelectric conversion unit PD to the floating diffusion FD, the selection signal φS is given to the selection gate SG. Thus, the potential of the floating diffusion FD is output as a signal potential from the amplification transistor ATr to the signal line 10 via the selection transistor STr.

Advantages of First Embodiment

In the solid-state imaging device 1-1 having the above-described configuration, the third impurity region 23 and the fourth impurity region 24 configured as the source/drain of the selection transistor STr used as the output transistor have different dimensions in the channel width direction. In this configuration, the signal line 10 is connected to the fourth impurity region 24 with the smaller dimension (size) in the channel width direction. Therefore, since the capacity of each fourth impurity region 24 connected to the signal line 10 is reduced, an operation speed of the signal line 10 is designed to be improved. As a result, the number of pixels increases. Therefore, even when the number of pixel driving circuits connected to one signal line 10 increases, the imaging signal can be read at a high speed via the signal line 10.

In the second active region 2b in which the selection transistor STr is installed, only the tip portion in which the fourth impurity region 24 is disposed has a small opening shape in the channel width direction of the selection transistor STr. Therefore, in the selection transistor STr, the dimension of the channel width below the selection gate SG is maintained to some extent, and thus characteristic deterioration is suppressed. Further, even in the amplification transistor ATr sharing the third impurity region 23 with the larger size in the channel width direction together with the selection transistor STr, the dimension of the channel width below the amplification gate AG is maintained to some extent. Accordingly, since the dimension (area) of the channel region in the amplification transistor ATr is ensured, it is possible to obtain the advantage of preventing random noise caused due to the miniaturization of the amplification transistor ATr from occurring.

In the solid-state imaging device 1-1 according to the first embodiment, as described above, the reduction in the random noise can be compatible with the high-speed reading of the image signal.

3. First Modification Example (Example in which Position of Gate Electrode of Output Transistor is Changed)

Figure 4:
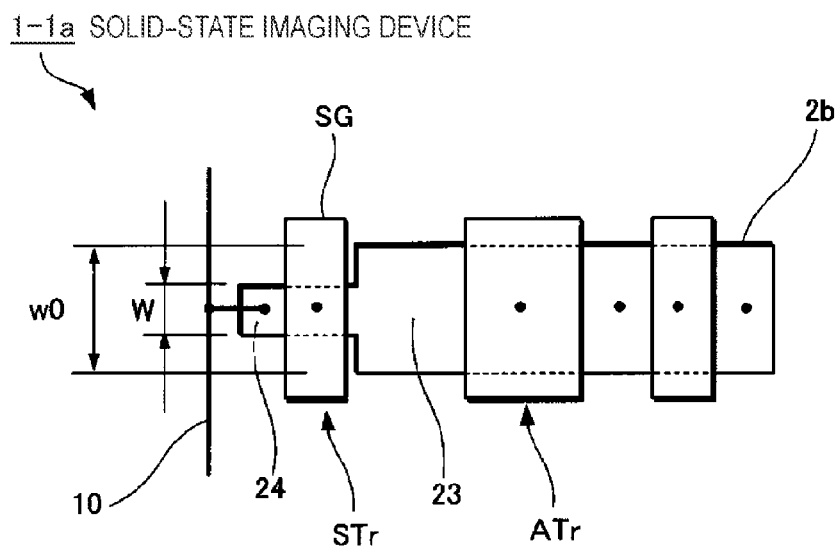
FIG. 4 is an explanatory plan view illustrating main units according to a first modification example of the first embodiment.

FIG. 4 is an explanatory plan view according to a first modification example of the first embodiment and is an expanded view illustrating the periphery of the portion in which the second active region 2b described in the first embodiment is disposed. As illustrated in the drawing, a solid-state imaging device 1-1a according to the first modification example is different from that of the first embodiment in that the arrangement state of the selection gate SG in the second active region 2b is different. The other configuration is the same as that of the first embodiment.

That is, in the solid-state imaging device 1-1a according to the first modification example, the selection gate SG of the selection transistor STr used as the output transistor is installed in the portion with the opening width W of the smaller size in the second active region 2b. Therefore, of the third impurity region 23 and the fourth impurity region 24 forming the selection transistor STr, the third impurity region 23 shared with the amplification transistor ATr is installed across the portion with the predetermined opening width W0 to the portion with the opening width W in the second active region 2b. Thus, the other fourth impurity region 24 is installed in the portion with the opening width W with the small size in the second active region 2b.

In the second active region 2b, the selection gate SG may be installed across the portion with the predetermined opening width W0 and the portion with the opening width W of the small size in the second active region 2b.

Advantages of First Modification Example

Even in the solid-state imaging device 1-1a according to the above-described first modification example, the reduction in the random noise can be compatible with the high-speed reading of the image signal, as in the solid-state imaging device according to the first embodiment.

4. Second Modification Example (Example of Adjustment by Depth of Impurity Region of Output Transistor)

Figure 5:
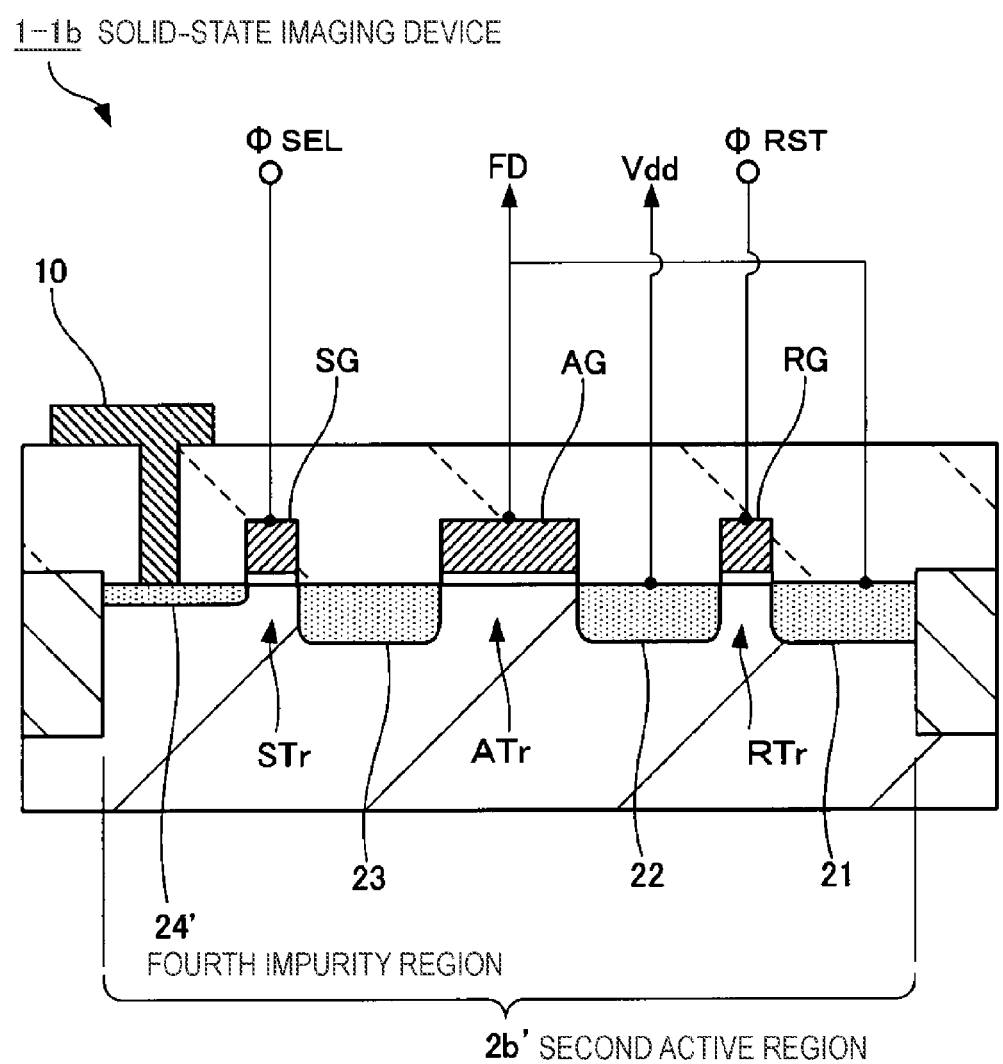
FIG. 5 is an explanatory sectional view according to a second modification example of the first embodiment.
Figure 6:
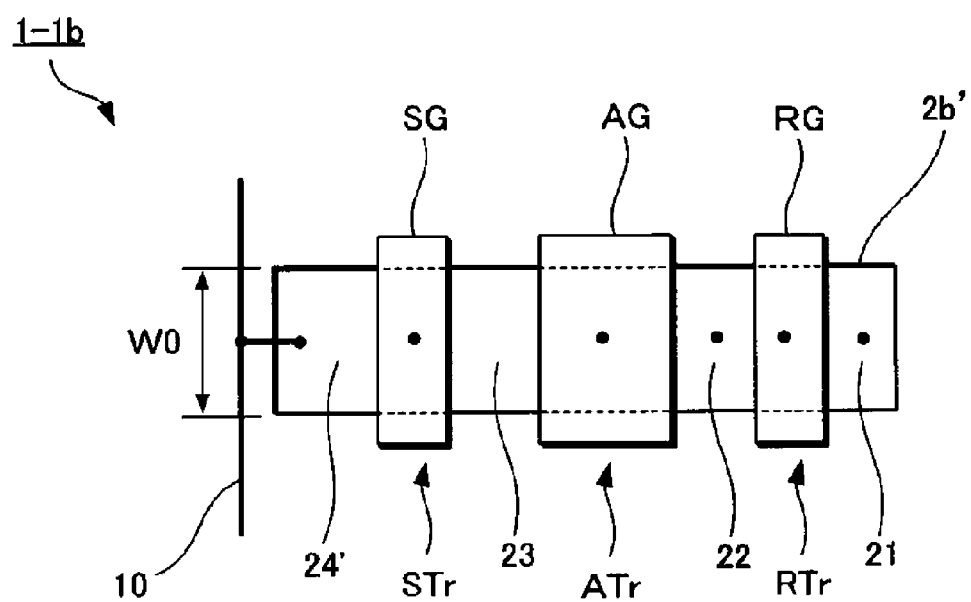
FIG. 6 is a plan view corresponding to the sectional view of FIG. 5.

FIG. 5 is an explanatory sectional view according to a second modification example of the first embodiment. FIG. 6 is a plan view corresponding to the sectional view of FIG. 5. As illustrated in the drawing, a solid-state imaging device 1-1b according to the second modification example is different from that of the first embodiment in that a fourth impurity region 24' forming the selection transistor STr has a different shape. The other configuration is the same as that of the first embodiment.

That is, in a selection transistor STr used as an output transistor in the solid-state imaging device 1-1b according to the second modification example, the fourth impurity region 24' used as a source/drain is formed to be shallower than the other impurity regions 21, 22, and 23. On the other hand, the fourth impurity region 24' is formed in a planar shape with the same dimension in the channel width direction as the other impurity regions 21, 22, and 23. Accordingly, the opening shape of the second active region 2b' in which the selection transistor STr is disposed is a rectangular shape of the predetermined opening width W0.

The gates RG, AG, and SG of the transistors RTr, ATr, and STr installed in the above-described second active region 2b' are disposed to be parallel in the direction of the opening width W0 of the second active region 2b'.

Advantages of Second Modification Example

In the solid-state imaging device 1-1b according to the above-described second modification example, the third impurity region 23 and the fourth impurity region 24' forming the source/drain of the selection transistor STr used as the output transistor are configured to be different in depth. In this configuration, the signal line 10 is connected to the fourth impurity region 24' with the smaller depth. Therefore, as in the first embodiment, the capacity of each fourth impurity region 24' connected to the signal line 10 is reduced and the imaging signal can be read via the signal line 10 at a high speed.

The second active region 2b' in which the selection transistor STr is installed is formed in the rectangular opening shape in which the predetermined opening width W0 is maintained. Therefore, as in the first embodiment, in the selection transistor STr, the dimension of the channel width is maintained to some extent and the characteristic deterioration is suppressed. Further, in the amplification transistor ATr, the dimension of the channel width is maintained to some extent. Accordingly, it is possible to obtain the advantage of preventing the random noise caused due to the miniaturization of the amplification transistor ATr from occurring.

Even in the solid-state imaging device 1-1b according to the above-described second modification example, the reduction in the random noise can be compatible with the high-speed reading of the image signal as in the solid-state imaging device according to the first embodiment.

As another advantage, since the opening shape of the second active region 2b' may be rectangular, it is not necessary to change a mask used to form the second active region 2b', and thus an increase in the manufacturing cost is suppressed.

In the second modification example, the opening shape of the second active region 2b' is configured to be rectangular and the dimension of the fourth impurity region 24' in the channel width direction is set to be the same as that of the other impurity regions 21, 22, and 23. However, the configuration according to the second modification example may be combined with the configuration according to the first embodiment or the first modification example. In this case, in the configuration according to the first embodiment or the second modification example, the depth of the fourth impurity region 24' may be shallower than that of the other impurity regions 21, 22, and 23. In each configuration, the capacity of the fourth impurity region 24' connected to the signal line 10 can be reduced compared to the configuration according to the first embodiment or the first modification example. Accordingly, a faster reading speed can be achieved.

5. Third Modification Example (Example in which Photoelectric Conversion Unit is Expanded)

Figure 7:
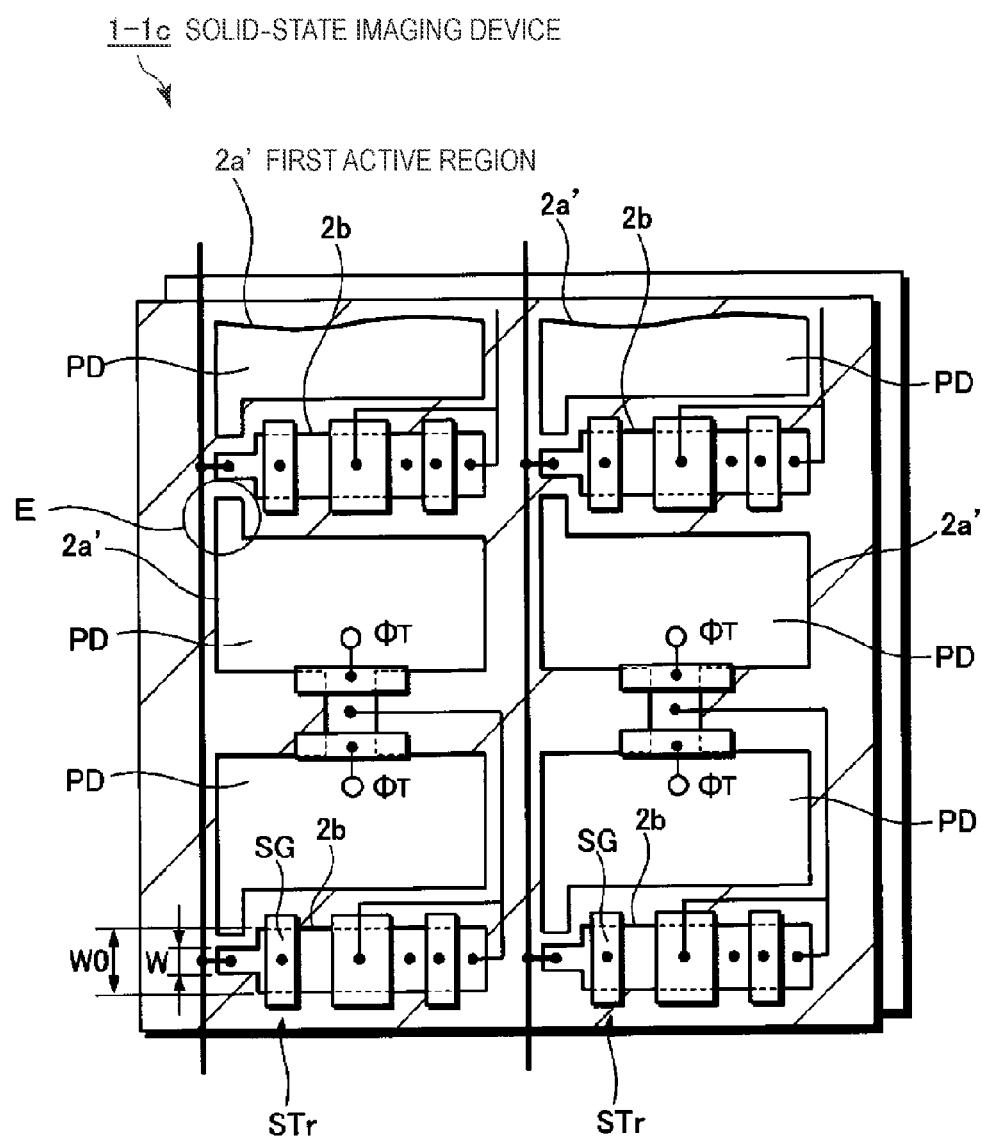
FIG. 7 is an explanatory plan view according to a third modification example of the first embodiment.

FIG. 7 is an explanatory sectional view according to a third modification example of the first embodiment. As illustrated in the drawing, in a solid-state imaging device 1-1c according to the third modification example, the opening shape of a first active region 2a' in which the photoelectric conversion unit PD is installed has an extension portion E. The other configuration is the same as that of the first embodiment.

In the solid-state imaging device 1-1c according to the third modification example, the opening shape of the first active region 2a' in which the photoelectric conversion unit PD is installed has the extension portion E extending to the side of the second active region 2b. As described in detail in the first embodiment, the second active region 2b in which the selection transistor STr is installed as the output transistor is formed such that the one end in the length direction has the opening width W (<W0) smaller in size than the opening width W0. Therefore, the extension portion E extending in a planar form from the first active region 2a' is formed in the portion in which the opening width is contracted in the second active region 2b. Accordingly, the planar shape of the photoelectric conversion unit PD formed in the first active region 2a' is also extended by the extension portion E.

Advantages of Third Modification Example

In the configuration according to the above-described third modification example, it is possible to enlarge the occupation area of the photoelectric conversion unit PD and improve light reception sensitivity in addition to the advantages of the first embodiment.

The configuration according to the third modification example can be combined with the configuration according to the first modification example described with reference to FIG. 4 to obtain the advantages.

6. Second Embodiment (First Example of Solid-State Imaging Device in which Amplification Transistor Serves as Output Transistor)

Figure 8:
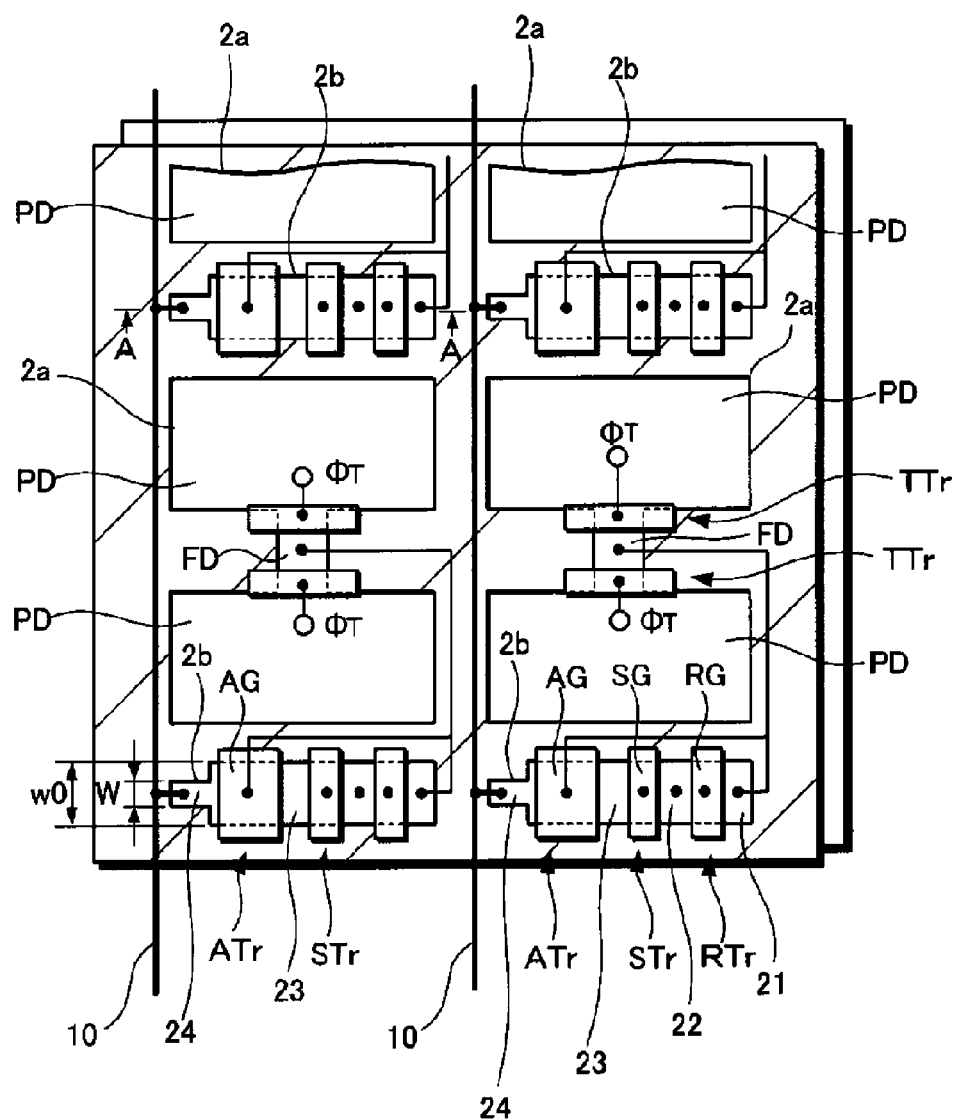
FIG. 8 is a plan view illustrating the configuration of main units of a solid-state imaging device according to a second embodiment.
Figure 9:
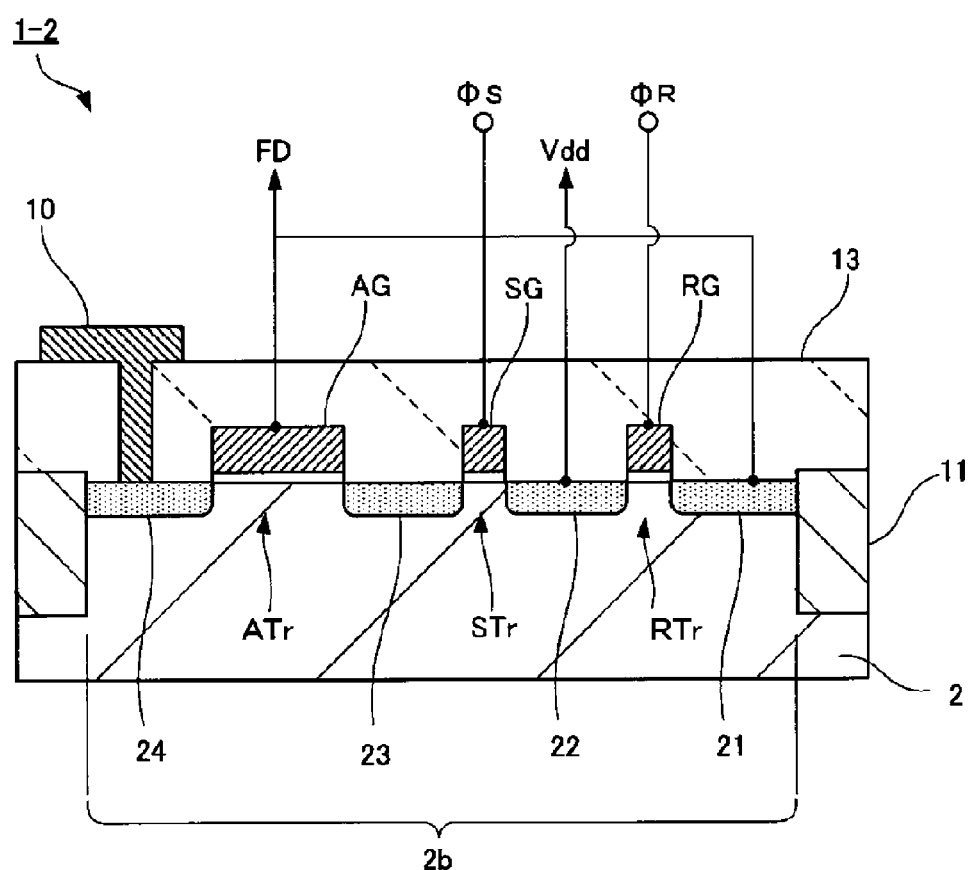
FIG. 9 is a sectional view taken along line A-A of FIG. 8.

FIG. 8 is a plan view illustrating the configuration of main units of a solid-state imaging device 1-2 according to a second embodiment and corresponds to the partially expanded plan view illustrating the imaging region 3 in FIG. 1. FIG. 9 is a sectional view taken along line A-A of FIG. 8. The solid-state imaging device 1-2 illustrated in the drawings according to the second embodiment is different from the solid-state imaging device according to the first embodiment in that the amplification transistor ATr is used as an output transistor. Accordingly, the arrangement order of three transistors RTr, STr, ATr in the second active region 2b is different from that of the first embodiment. Since the other configuration is the same as that of the first embodiment, the description thereof will be omitted.

That is, the solid-state imaging device 1-2 according to the second embodiment includes a first active region 2a and a second active region 2b with the same opening shape as that of the first embodiment. The photoelectric conversion units PD and the transmission transistor TTr which are the same as those of the first embodiment are installed in the first active region 2a. On the other hand, as will be described below, unlike the first embodiment, three transistors RTr, STr, and ATr are installed in the second active region 2b in the state in which the amplification transistor ATr is connected to a signal line 10.

<Reset Transistor RTr>

Of the three transistors RTr, STr, and ATr, the arrangement state and the connection state of the reset transistor RTr are the same as those of the first embodiment.

<Selection Transistor STr>

The selection transistor STr is installed to share a second impurity region 22 of the reset transistor RTr in a portion with a predetermined opening width W0 in the second active region 2b. The selection transistor STr includes a selection gate SG that is installed to intersect the second active region 2b in the direction of the opening width W0, and the second impurity region 22 and a third impurity region 23 that are installed on both sides of the selection gate SG in the second active region 2b. The second impurity region 22 and the third impurity region 23 have a planar shape in which the element separation 11 and the selection gate SG are used as masks. Accordingly, the second impurity region 22 and the third impurity region 23 have the same dimension in the channel width direction. Further, the second impurity region 22 and the third impurity region 23 are formed at the same depth in a surface layer of the semiconductor substrate 2.

In the above-described configuration, the pixel driving line (not illustrated here) is connected to the selection gate SG and a selection signal ϕS is input. The second impurity region 22 and the third impurity region 23 are a so-called source/drain. A power voltage Vdd is supplied to the second impurity region 22 shared with the reset transistor RTr.

<Amplification Transistor ATr>

The amplification transistor ATr is used as an output transistor and is disposed from the portion with the predetermined opening width W0 and a portion with the opening width W of a smaller size in the second active region 2b. The amplification transistor ATr is installed to share the third impurity region 23 of the selection transistor STr.

The amplification transistor ATr includes an amplification gate AG that is installed to intersect the second active region 2b in the direction of the opening width W0, and the third impurity region 23 and a fourth impurity region 24 that are installed on both sides of the amplification gate AG in the second active region 2b.

Of the amplification gate AG, the third impurity region 23, and the fourth impurity region 24, the amplification gate AG is disposed in the portion with the predetermined opening width W0 in the second active region 2b. Therefore, of the third impurity region 23 and the fourth impurity region 24, the entire third impurity region 23 shared with the selection transistor STr is installed in the portion with the predetermined opening width W0 in the second active region 2b. On the other hand, the other fourth impurity region 24 is installed across the portion with the predetermined opening width W0 and the portion with the opening width W of the small size in the second active region 2b. The third impurity region 23 and the fourth impurity region 24 have a planar shape in which the element separation 11 and the amplification gate AG are used as masks. Accordingly, the third impurity region 23 and the fourth impurity region 24 can be said to have different dimensions in the channel width direction of the amplification transistor ATr including the third impurity region 23 and the fourth impurity region 24.

In the above-described configuration, the amplification gate AG is connected to the floating diffusion FD. Thus, the amplification transistor ATr is electrically connected to the photoelectric conversion unit PD via the floating diffusion FD of the transmission transistor TTr.

The third impurity region 23 and the fourth impurity region 24 are a so-called source/drain and the fourth impurity region 24 with the smaller size in the above-described channel width direction is connected to the signal line 10.

<Driving of Solid-State Imaging Device 1-2>

A pixel driving circuit of the solid-state imaging device 1-2 including the above-described constituent elements operates as in the solid-state imaging device 1-1 according to the first embodiment. Moreover, when the selection signal ϕS is given to the selection gate SG, the potential of the floating diffusion FD is output from the amplification transistor ATr to the signal line 10 without passing through the selection transistor.

Advantages of Second Embodiment

In the solid-state imaging device 1-2 having the above-described configuration, the third impurity region 23 and the fourth impurity region 24 configured as the source/drain of the amplification transistor ATr used as the output transistor different dimensions in the channel width direction. In this configuration, the signal line 10 is connected to the fourth impurity region 24 with the smaller dimension (size) in the channel width direction. Therefore, as in the first embodiment, the capacity of each fourth impurity region 24 connected to the signal line 10 is reduced. Therefore, even when the number of pixel driving circuits connected to one signal line 10 increases, the imaging signal can be read at a high speed via the signal line 10.

In the second active region 2b, only the tip portion in which the fourth impurity region 24 is disposed has the small opening shape in the channel width direction. Therefore, as in the first embodiment, in the selection transistor STr, the dimension of the channel width below the selection gate SG is maintained to some extent, and thus characteristic deterioration is suppressed. Further, even in the amplification transistor ATr, the dimension of the channel width below the amplification gate AG is maintained to some extent, and thus it is possible to obtain the advantage of preventing random noise caused due to the miniaturization of the amplification transistor ATr from occurring.

Even in the solid-state imaging device 1-2 according to the second embodiment, as described above, the reduction in the random noise can be compatible with the high-speed reading of the image signal.

The configuration of the above-described second embodiment may be combined with the configuration of the second modification example of the first embodiment described with reference to FIGS. 5 and 6 and the configuration of the third modification example of the first embodiment described with reference to FIG. 7 to obtain the respective advantages. Further, when the influence of the random noise may not be considered, the configuration of the second embodiment may be combined with the configuration of the first modification example of the first embodiment described with reference to FIG. 4.

7. Third Embodiment (Second Example of Solid-State Imaging Device in which Amplification Transistor Serves as Output Transistor)

Figure 10:
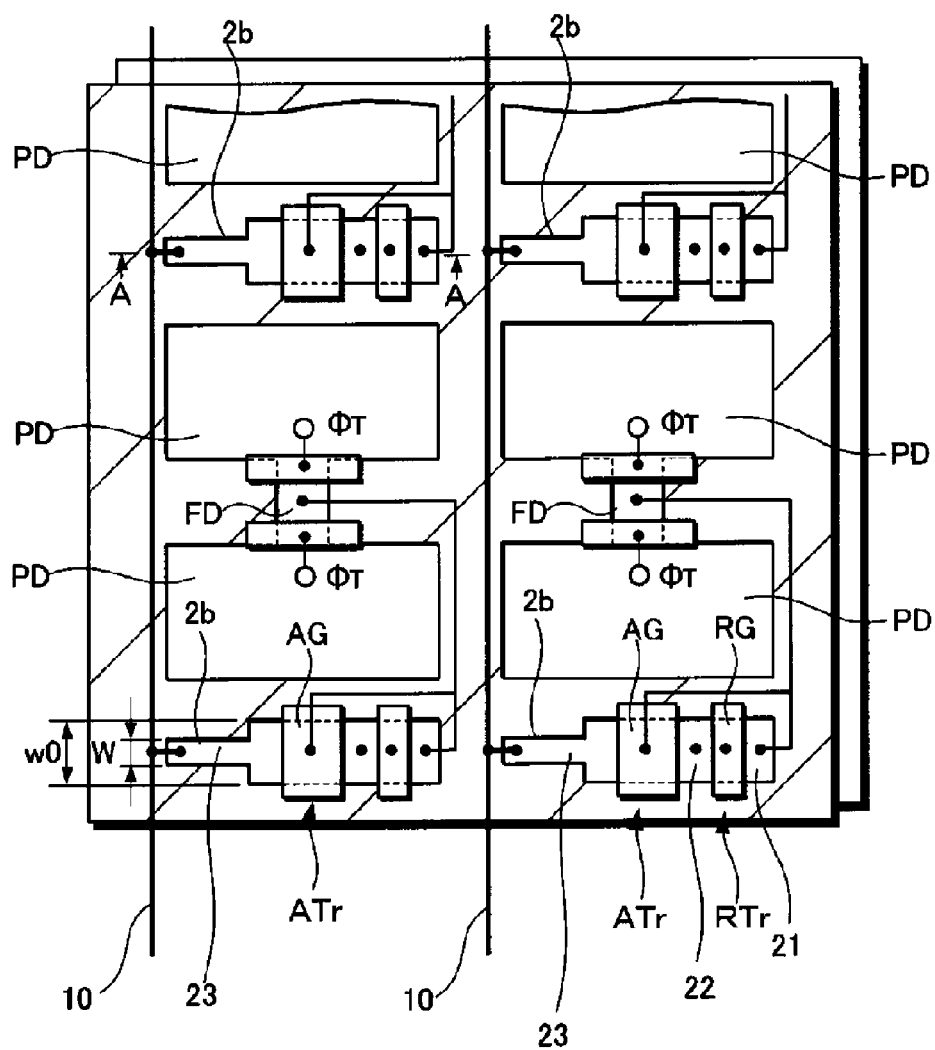
FIG. 10 is a plan view illustrating the configuration of main units of a solid-state imaging device according to a third embodiment.
Figure 11:
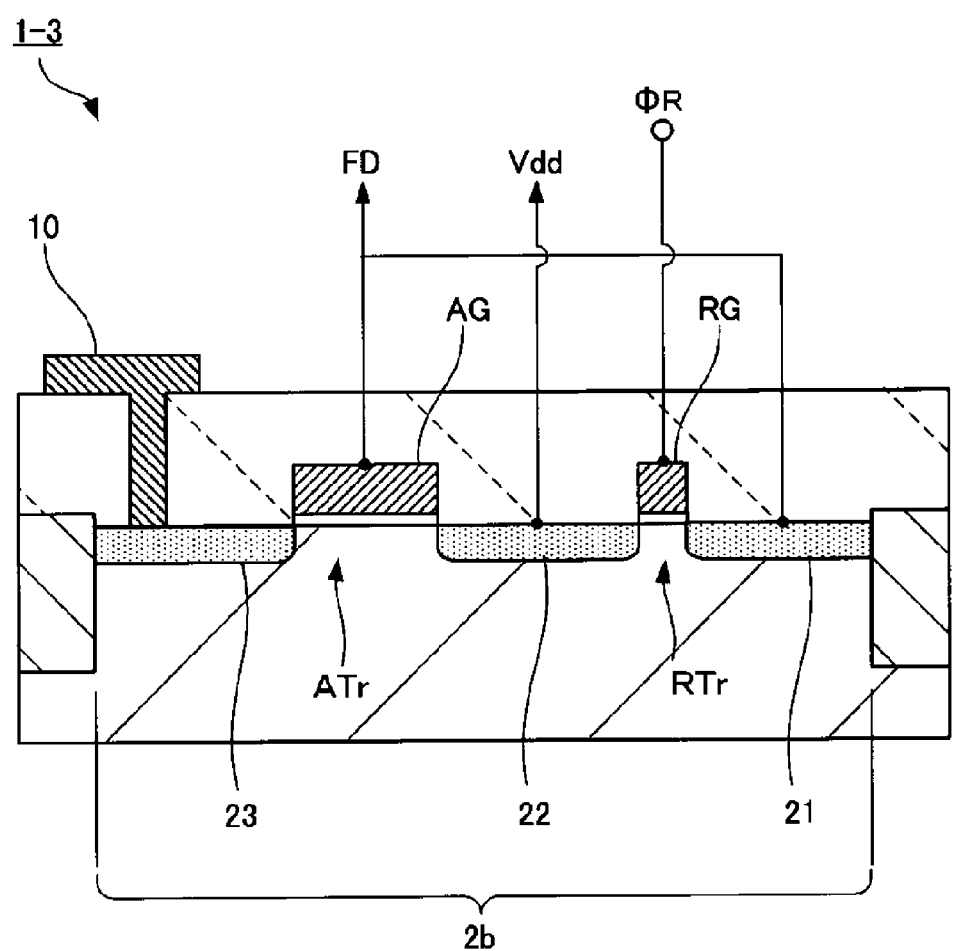
FIG. 11 is a sectional view taken along line A-A of FIG. 10.

FIG. 10 is a schematic plan view illustrating the configuration of the main units of a solid-state imaging device 1-3 according to a third embodiment and corresponds to a partially expanded plan view of the imaging region 3 in FIG. 1. FIG. 11 is a sectional view taken along line A-A of FIG. 10. The solid-state imaging device 1-3 illustrated in the drawings according to the third embodiment is different from the solid-state imaging device according to the first embodiment in that two transistors are installed in a second active region 2b and an amplification transistor ATr is used as an output transistor. Since the other configuration is the same as that of the first embodiment, the description thereof will be omitted.

That is, the solid-state imaging device 1-3 according to the third embodiment includes the first active region 2a and a second active region 2b with the same opening shape as that of the first embodiment. The photoelectric conversion units PD and the transmission transistor TTr which are the same as those of the first embodiment are installed in the first active region 2a. On the other hand, as will be described below, the two transistors RTr and ATr are installed in the second active region 2b and the amplification transistor ATr is connected to a signal line 10 unlike the first embodiment.

<Reset Transistor RTr>

The arrangement state and the connection state of the reset transistor RTr are the same as those of the first embodiment.

<Amplification Transistor ATr>

The amplification transistor ATr is used as an output transistor and is disposed from a portion with the predetermined opening width W0 and a portion with the opening width W of a smaller size in the second active region 2b. The amplification transistor ATr is installed to share the second impurity region 22 of the reset transistor RTr.

The amplification transistor ATr includes an amplification gate AG that is installed to intersect the second active region 2b in the direction of the opening width W0, and the second impurity region 22 and a third impurity region 23 that are installed on both sides of the amplification gate AG in the second active region 2b.

Of the amplification gate AG, the second impurity region 22, and the third impurity region 23, the amplification gate AG is disposed in the portion with the predetermined opening width W0 in the second active region 2b. Therefore, of the second impurity region 22 and the third impurity region 23, the entire second impurity region 22 shared together with the reset transistor RTr is installed in the portion with the predetermined opening width W0 in the second active region 2b. On the other hand, the other third impurity region 23 is installed across the portion with the predetermined opening width W0 and the portion with the opening width W of the small size in the second active region 2b. The second impurity region 22 and the third impurity region 23 have a planar shape in which the element separation 11 and the amplification gate AG are used as masks. Accordingly, the second impurity region 22 and the third impurity region 23 can be said to have different dimensions in the channel width direction of the amplification transistor ATr including the second impurity region 22 and the third impurity region 23.

In the above-described configuration, the amplification gate AG is connected to the floating diffusion FD. Thus, the amplification transistor ATr is electrically connected to the photoelectric conversion unit PD via the floating diffusion FD.

The second impurity region 22 and the third impurity region 23 are a so-called source/drain and the third impurity region 23 with the smaller size in the above-described channel width direction is connected to the signal line 10.

<Driving of Solid-State Imaging Device 1-3>

The pixel driving circuits of the solid-state imaging device 1-3 including the above-described constituent elements operate as follows, as in a general pixel driving circuit configured to include 3 transistors. That is, first, a signal charge (here, electrons) photoelectrically converted and accumulated in the photoelectric conversion unit PD is transmitted to the floating diffusion FD when a transmission signal φT is given to the transmission gate TG. Then, the pixels are selected or not selected by the potential of the floating diffusion FD, and the potential of the floating diffusion FD in the selected pixel is output as a signal potential from the amplification transistor ATr to the signal line 10.

Before the signal charge is transmitted from the photoelectric conversion unit PD to the floating diffusion FD, a reset signal φR is given to the reset gate RG, so that the potential of the floating diffusion FD is reset.

Advantages of Third Embodiment

In the solid-state imaging device 1-3 having the above-described configuration, the second impurity region 22 and the third impurity region 23 configured as the source/drain of the amplification transistor ATr used as the output transistor have the different dimensions in the channel width direction. In this configuration, the signal line 10 is connected to the third impurity region 23 with the smaller dimension (size) in the channel width direction. Therefore, as in the first embodiment, the capacity of each third impurity region 23 connected to the signal line 10 is reduced. Therefore, even when the number of pixel driving circuits connected to one signal line 10 increases, the imaging signal can be read at high speed via the signal line 10.

In the second active region 2b in which the amplification transistor ATr is installed, only the tip portion in which the third impurity region 23 is disposed has a small opening shape in the channel width direction of the amplification transistor ATr. Therefore, as in the first embodiment, in the amplification transistor ATr, the dimension of the channel width below the amplification gate AG is maintained to some extent, and thus it is possible to obtain the advantage of preventing random noise caused due to the miniaturization of the amplification transistor ATr from occurring.

Even in the solid-state imaging device 1-3 according to the third modification example, the reduction in the random noise can be compatible with the high-speed reading of the image signal.

The configuration of the above-described third embodiment may be combined with the configuration of the second modification example of the first embodiment described with reference to FIGS. 5 and 6 and the configuration of the third modification example of the first embodiment described with reference to FIG. 7 to obtain the respective advantages. Further, when the influence of the random noise may not be considered, the configuration of the third embodiment may be combined with the configuration of the first modification example of the first embodiment described with reference to FIG. 4.

In the embodiments and the modification examples described above, the configurations in which one main surface of the semiconductor substrate 2 is divided into the first active region 2a and the second active region 2b and the plurality of transistors are disposed in the second active region 2b have been described. However, the connection relation between the floating diffusion and each of the transistors RTr, ATr, and STr may be equivalent to the exemplified connection relation. Therefore, the first active region 2a and the second active region 2b may be continuous regions. The second active region 2b may be divided into two or three regions in which the respective transistors RTr, ATr, and STr are disposed.

8. Fourth Embodiment (Electronic Device Using Solid-State Imaging Device)

The solid-state imaging device according to each of the embodiments and the modification examples of the present technology described above can be provided as a solid-state imaging device for an electronic apparatus such as a camera system such as a digital camera or a video camera, a portable telephone having an imaging function, or other devices having an imaging function.

Figure 12:
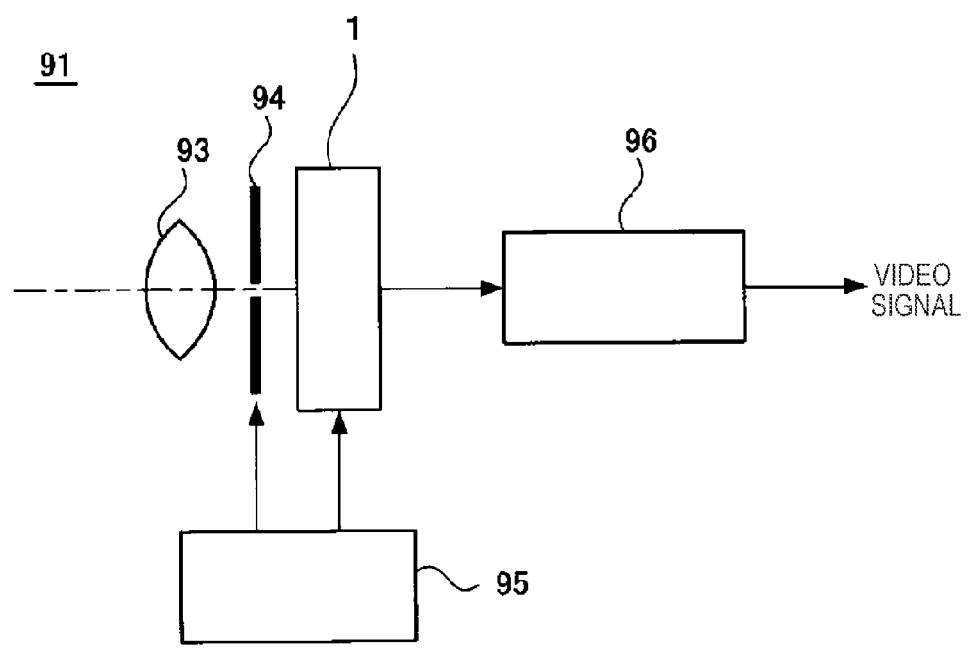
FIG. 12 is a schematic diagram illustrating the configuration of an electronic device according to a fourth embodiment.

FIG. 12 is a diagram illustrating the configuration of a camera using a solid-state imaging element used as an example of an electronic device according to an embodiment of the present technology. The camera according to this embodiment is an example of a video camera capable of capturing a still image or a moving image. A camera 91 includes a solid-state imaging device 1, an optical system 93 that guides incident light to an imaging region of the solid-state imaging device 1, a shutter device 94, a driving circuit 95 that drives the solid-state imaging device 1, and a signal processing circuit 96 that processes an output signal of the solid-state imaging device 1.

The solid-state imaging device 1 is a solid-state imaging device having the configuration described in each of the embodiments and the modification examples described above. The optical system (optical lens) 93 forms an image of image light (incident light) from a subject on an imaging surface of the imaging region of the solid-state imaging device 1. A plurality of pixels are arrayed on the imaging surface. The incident light from the optical system 93 is guided to photoelectric conversion units of the solid-state imaging element in the pixels. Thus, signal charges are accumulated for a given period in the photoelectric conversion units of the solid-state imaging device 1. The optical system 93 may be an optical lens system including a plurality of optical lenses.

The shutter device 94 controls a light irradiation period and a light blocking period in the solid-state imaging device 1. The driving circuit 95 supplies a driving signal to the solid-state imaging device 1 and the shutter device 94 to control a signal output operation of the solid-state imaging device 1 to the signal processing circuit 96 and a shutter operation of the shutter device 94 based on the supplied driving signal (timing signal). That is, the driving circuit 95 supplies a driving signal (timing signal) to perform an operation of transmitting a signal from the solid-state imaging device 1 to the signal processing circuit 96. The signal processing circuit 96 performs various kinds of signal processing on a signal transmitted from the solid-state imaging device 1. A video signal subjected to the signal processing is stored in a storage medium such as a memory or is output to a monitor.

Since the electronic device according to the above-described embodiment includes the solid-state imaging device designed so that the reduction of random noise can be compatible with high-speed reading of an image signal, as described above in the embodiments it is possible to realize miniaturization and high functionalization of an electronic device having an imaging function.

Additionally, the present technology may also be configured as below.

(1) A solid-state imaging device including:
a plurality of photoelectric conversion units;
a signal line that is wired along the plurality of photoelectric conversion units; and
an output transistor that is electrically connected to each of the photoelectric conversion units and includes a gate electrode and two impurity regions, the two impurity regions being disposed on both sides of the gate electrode and being different in sizes in terms of at least one of a dimension in a channel width direction and a depth, the signal line being connected to one of the two impurity regions that has a smaller size.

(2) The solid-state imaging device according to (1), further including:
a first active region in which the photoelectric conversion unit is installed; and
a second active region in which an opening width of one end side is small,
wherein, in the output transistor, a portion with the small opening width of the second active region is set as the impurity region with the smaller size.

(3) The solid-state imaging device according to (2), further including:
an amplification transistor that includes an amplification gate electrically connected to the photoelectric conversion unit and has a configuration in which the amplification gate is installed in a portion with a large opening width of the second active region.

(4) The solid-state imaging device according to (3), wherein the amplification transistor shares one of the two impurity regions that has a larger size with the output transistor.

(5) The solid-state imaging device according to (4), wherein the output transistor is a selection transistor that includes a selection gate to which a selection signal is input.

(6) The solid-state imaging device according to (5), wherein the selection gate is formed in the portion with the large opening width of the second active region.

(7) The solid-state imaging device according to (3) or (4), wherein the amplification transistor is installed as the output transistor to which the signal line is connected.

(8) The solid-state imaging device according to (7), further including:
a selection transistor that shares one of the two impurity regions that has a larger size with the amplification transistor in the second active region and includes a selection gate to which a selection signal is input.

(9) The solid-state imaging device according to (7), further including:
a reset transistor that shares one of the two impurity regions that has a larger size with the amplification transistor in the second active region and includes a reset gate to which a reset signal is input.

(10) The solid-state imaging device according to any one of (1) to (9), further including:
a transmission gate that is disposed to be adjacent to the photoelectric conversion unit; and
a floating diffusion that is disposed to be adjacent to the transmission gate,
wherein the output transistor is electrically connected to the photoelectric conversion unit via the floating diffusion.

(11) The solid-state imaging device according to any one of (2) to (10), wherein the first active region and the second active region are separated by an element separation.

(12) An electronic device including:
a plurality of photoelectric conversion units;
a signal line that is wired along the plurality of photoelectric conversion units;
an output transistor that is electrically connected to each of the photoelectric conversion units and includes a gate electrode and two impurity regions, the two impurity regions being disposed on both sides of the gate electrode and being different in sizes in terms of at least one of a dimension in a channel width direction and a depth, the signal line being connected to one of the two impurity regions that has a smaller size; and
an optical system that guides incident light toward the photoelectric conversion units.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-145615 filed in the Japan Patent Office on Jun. 28, 2012, the entire content of which is hereby incorporated by reference.

What is claimed is:

1. A solid-state imaging device, comprising:
a substrate;
a plurality of photoelectric conversion units on the substrate;
a signal line wired along the plurality of photoelectric conversion units; and
an output transistor configured to electrically connect to each of the plurality of photoelectric conversion units,
wherein the output transistor includes a first impurity region, a gate, and a second impurity region in a top surface of the substrate,
wherein a first depth of the first impurity region is less than a second depth of the second impurity region,
wherein each of the first depth and the second depth is along a direction perpendicular to the top surface of the substrate, and
wherein the signal line is in direct physical contact with the first impurity region.

2. The solid-state imaging device according to claim 1, further comprising:
a first active region; and
a second active region that comprises the plurality of photoelectric conversion units,
wherein a first opening width of a first end of the first active region is smaller than a second opening width of a second end of the first active region,
wherein a first portion, in the output transistor, associated with the first end of the first active region, is the first impurity region.

3. The solid-state imaging device according to claim 2, further comprising:
an amplification transistor configured to electrically connect to the plurality of photoelectric conversion units,
wherein the amplification transistor comprises an amplification gate in a second portion associated with the second end of the first active region.

4. The solid-state imaging device according to claim 3, wherein the amplification transistor shares the second impurity region with the output transistor.

5. The solid-state imaging device according to claim 4, wherein the output transistor is a selection transistor that comprises a selection gate configured to receive a selection signal.

6. The solid-state imaging device according to claim 5, wherein the selection gate is in the second portion of the first active region.

7. The solid-state imaging device according to claim 2, wherein the output transistor is an amplification transistor that is configured to connect to the signal line.

8. The solid-state imaging device according to claim 7, further comprising:
a selection transistor that shares the second impurity region with the amplification transistor in the first active region,
wherein the selection transistor comprises a selection gate that is configured to receive a selection signal.

9. The solid-state imaging device according to claim 7, further comprising:
a reset transistor that shares the second impurity region with the amplification transistor, in the first active region,
wherein the reset transistor comprises a reset gate that is configured to receive a reset signal.

10. The solid-state imaging device according to claim 1, further comprising:
    a transmission gate adjacent to each of the plurality of photoelectric conversion units; and
    a floating diffusion adjacent to the transmission gate,
    wherein the output transistor is further configured to electrically connect to the plurality of photoelectric conversion units via the floating diffusion.

11. The solid-state imaging device according to claim 2, wherein a separation element separates the first active region and the second active region.

12. An electronic device, comprising:
    a substrate;
    a plurality of photoelectric conversion units on the substrate;
    a signal line wired along the plurality of photoelectric conversion units;
    an output transistor configured to electrically connect to each of the plurality of photoelectric conversion units,
    wherein the output transistor includes a first impurity region, a gate, and a second impurity region in a top surface of the substrate,
    wherein a first depth of the first impurity region is less than a second depth of the second impurity region,
    wherein each of the first depth and the second depth is along a direction perpendicular to the top surface of the substrate, and
    wherein the signal line is in direct physical contact with the first impurity region; and
    an optical system configured to guide incident light toward the plurality of photoelectric conversion units.

13. The solid-state imaging device according to claim 1, wherein the first impurity region and the second impurity region have a planar shape, and
    wherein the first depth of the first impurity region in the substrate is shallower than the second depth of the second impurity region.

* * * * *